(12) United States Patent
Hattori

(10) Patent No.: US 7,525,322 B2
(45) Date of Patent: Apr. 28, 2009

(54) CAPACITIVE PHYSICAL QUANTITY SENSOR AND DIAGNOSIS METHOD

(75) Inventor: Seiji Hattori, Kariya (JP)

(73) Assignee: DENSO CORPORATION, Kariya (JP)

( * ) Notice: Subject to any disclaimer, the term of this patent is extended or adjusted under 35 U.S.C. 154(b) by 230 days.

(21) Appl. No.: 11/654,546

(22) Filed: Jan. 18, 2007

(65) Prior Publication Data

US 2007/0236231 A1 Oct. 11, 2007

(30) Foreign Application Priority Data

Mar. 23, 2006 (JP) ............................. 2006-080684

(51) Int. Cl.
*G01R 27/26* (2006.01)
*G01P 15/00* (2006.01)
(52) U.S. Cl. ...................... 324/679; 324/658; 73/514.32
(58) Field of Classification Search ................. 324/658, 324/679
See application file for complete search history.

(56) References Cited

U.S. PATENT DOCUMENTS 5,506,454 A 4/1996 Hanzawa et al.
6,668,614 B2 12/2003 Itakura
6,809,527 B2 10/2004 Ishio et al.
2004/0237651 A1* 12/2004 Furuichi ................... 73/514.32
2005/0016273 A1* 1/2005 Murata et al. ............ 73/514.32

FOREIGN PATENT DOCUMENTS

JP A-05-281256 10/1993

OTHER PUBLICATIONS

Office Action dated Sep. 29, 2008 in corresponding German patent application No. 10 2007 013 825.5-52 (and English translation).

* cited by examiner

*Primary Examiner*—Vincent Q Nguyen
(74) *Attorney, Agent, or Firm*—Posz Law Group, PLC

(57) ABSTRACT

A capacitive sensor for detecting a physical quantity includes a sensor element and a detecting circuit. The sensor element includes a movable electrode and a fixed electrode. A periodic voltage is applied to the fixed electrode. A high-voltage generating circuit applies a diagnostic voltage to an input side of a C-V conversion circuit so as to diagnose a sticking of a foreign object between the movable electrode and the fixed electrode. The C-V conversion circuit includes a diagnostic switch, which is opened in a diagnostic mode. The periodic voltage in the diagnostic mode is larger than the periodic voltage in a normal measuring mode.

7 Claims, 2 Drawing Sheets

CAPACITIVE PHYSICAL QUANTITY SENSOR AND DIAGNOSIS METHOD

CROSS REFERENCE TO RELATED APPLICATION

This application is based on Japanese Patent Application No. 2006-80684 filed on Mar. 23, 2006, the disclosure of which is incorporated herein by reference in its entirety.

BACKGROUND OF THE INVENTION

1. Field of the Invention

The present invention relates to a capacitive sensor for detecting a physical quantity by using a capacitance formed between a movable electrode and a fixed electrode in a sensor element. For example, the capacitive sensor is used as an acceleration sensor, and can perform a sticking diagnosis.

2. Description of Related Art

US 2005/0016273 A1 (corresponding to JP-A-2005-43309) discloses a capacitive acceleration sensor in a vehicle. In the sensor, a capacitance between a movable electrode and a fixed electrode in a sensor element is varied by acceleration. The capacitance is converted into an electrical signal by a capacitance-voltage (C-V) conversion circuit, and the signal is differentially amplified by a signal processing circuit including a sampling and holding circuit, and a switched capacitor circuit. Thus, the sensor can output the amplified signal as a sensor output.

If a foreign object is stuck between the movable electrode and the fixed electrode in the sensor element, the acceleration may not be detected, because the capacitance variation corresponding to the acceleration may not be generated. Therefore, a sticking diagnosis is performed, in which the movable electrode is forcibly moved toward the fixed electrode so as to make the movable electrode in contact with the fixed electrode.

In the sticking diagnosis, a voltage for moving the movable electrode toward the fixed electrode is applied. The sensor output is different in cases in which the foreign object is stuck between the movable electrode and the fixed electrode or not. This is because a clearance between the movable electrode and the fixed electrode is different in the cases. Therefore, the foreign object can be detected based on the difference of the sensor output. For example, a carrier wave voltage (10V) is applied to the fixed electrode in a diagnostic mode, which is larger than the carrier wave voltage in a normal acceleration-measuring mode. Further, a reference voltage applied to an operational amplifier in the C-V conversion circuit is increased from Vdd/2 in the normal mode to Vpp in the diagnostic mode. Thus, a potential of the movable electrode is increased to Vpp so as to displace the movable electrode. Then, the sensor output is monitored.

However, the sticking diagnosis may be performed only in a small-acceleration detecting sensor used for detecting a relatively small acceleration. A large-acceleration detecting sensor used for detecting a relatively large acceleration requires a larger voltage for its sticking diagnosis, because a spring constant of the movable electrode is larger in the large-acceleration detecting sensor. In this case, a semiconductor element, e.g., transistor, included in the C-V conversion circuit and the switched capacitor circuit is required to withstand the larger voltage. Therefore, a size of a semiconductor chip in a sensor circuit may be enlarged against demands for miniaturizations. However, the large-acceleration detecting sensor is required to perform the sticking diagnosis without the enlargement of the semiconductor chip.

SUMMARY OF THE INVENTION

In view of the foregoing and other problems, it is an object of the present invention to provide a capacitive physical quantity sensor, which can perform a sticking diagnosis while its movable electrode has a large spring constant.

According to a first example of the present invention, a capacitive sensor for detecting a physical quantity includes a sensor element and a detecting circuit. The sensor element includes a movable electrode displaceable in accordance with a physical quantity, and a fixed electrode faced to the movable electrode. A periodic carrier wave voltage is applied to the fixed electrode. The detecting circuit includes a C-V conversion circuit, a differential amplification circuit and a high-voltage generating circuit. The C-V conversion circuit outputs a voltage signal corresponding to a capacitance between the movable electrode and the fixed electrode, and includes a diagnostic switch. The differential amplification circuit differentially amplifies the voltage signal from the C-V conversion circuit, and outputs the amplified signal as a sensor output in a normal measuring mode. The high-voltage generating circuit applies a diagnostic voltage to an input side of the C-V conversion circuit in a diagnostic mode so as to diagnose a sticking of a foreign object between the movable electrode and the fixed electrode. The periodic carrier wave voltage in the diagnostic mode is larger than the periodic carrier wave voltage in the normal mode. The diagnostic switch is provided between the C-V conversion circuit and the differential amplification circuit. The diagnostic switch is closed in the normal mode to input the voltage signal from the C-V conversion circuit into the differential amplification circuit, and opened in the diagnostic mode to disconnect the C-V conversion circuit and the differential amplification circuit.

According to a second example, a method of diagnosing a physical quantity sensor includes a raising step, an applying step and a stopping step. The physical quantity sensor includes a movable electrode and a fixed electrode to which a carrier wave voltage is applied, a conversion circuit for outputting a voltage signal corresponding to a capacitance of the electrodes, and an amplifier circuit for producing a sensor output signal based on the voltage signal. In the raising step, the carrier wave voltage is raised at time of diagnosing the electrodes to be higher than that applied normally to detect physical quantity applied to the electrodes. In the applying step, a predetermined voltage is applied between the movable electrode and the conversion circuit at time of diagnosing the electrodes. In the stopping step, the voltage signal produced by the conversion circuit is stopped from being applied to the amplifier circuit at time of diagnosing the electrodes.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

First Embodiment

Figure 1:
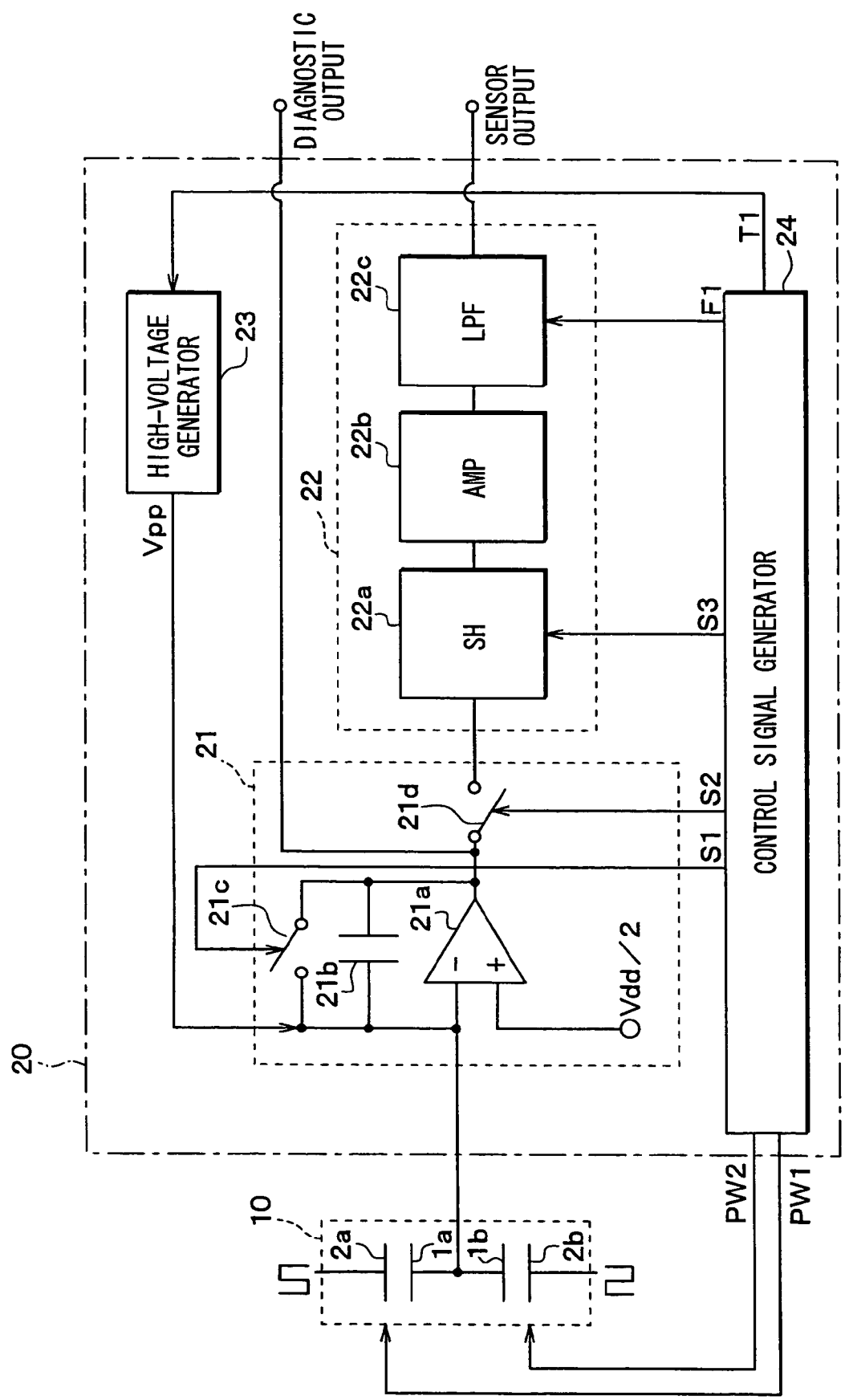
FIG. 1 is a block diagram showing a capacitive acceleration sensor according to a first embodiment of the present invention.

As shown in FIG. 1, an acceleration sensor includes a sensor element 10 and a detecting circuit 20. The sensor element 10 includes movable electrodes 1a, 1b and fixed electrodes 2a, 2b. The detecting circuit 20 detects an acceleration based on a variation of a differential capacitance between the movable electrode 1a, 1b and the fixed electrode 2a, 2b.

The sensor element 10 includes a beam structure, and the movable electrode 1a, 1b and the fixed electrode 2a, 2b are constructed with the beam structure. The differential capacitance is formed by the movable electrode 1a, 1b and the fixed electrode 2a, 2b, which are positioned to face each other. Each of carrier wave signals PW1, PW2 is periodically applied to each of the fixed electrodes 2a, 2b, and the signals PW1, PW2 applied to the fixed electrodes 2a, 2b are inverse to each other. Thereby, an acceleration is detected based on a variation of the differential capacitance, and the variation corresponds to a displacement of the movable electrode 1a, 1b.

The detecting circuit 20 includes a capacitance-voltage (C-V) conversion circuit 21, a differential amplification circuit 22, a high-voltage generating circuit 23 and a control signal generating circuit 24. The C-V conversion circuit 21 converts the differential capacitance into a voltage signal, and includes an operational amplifier 21a, a capacitor 21b, a switch 21c and a diagnostic switch 21d. An inverting input terminal of the amplifier 21a is connected to the movable electrodes 1a, 1b, and each of the capacitor 21b and the switch 21c is connected in parallel to the operational amplifier 21a between the inverting input terminal and an output terminal. The switch 21c is driven by a signal S1 from the control signal generating circuit 24. A non-inverting input terminal of the operational amplifier 21a is supplied with a half voltage Vdd/2 (2.5V) of a voltage Vdd (5V) applied to the fixed electrode 2a, 2b as a center (reference) voltage.

Further, the C-V conversion circuit 21 includes the diagnostic switch 21d for a sticking diagnosis. The diagnostic switch 21d is driven by a signal S2 from the control signal generating circuit 24. In a normal acceleration-measuring mode, the diagnostic switch 21d is closed, and an output from the C-V conversion circuit 21 is transmitted to the differential amplification circuit 22. In a sticking diagnostic mode, the diagnostic switch 21d is opened, thereby the C-V conversion circuit 21 and the differential amplification circuit 22 are disconnected from each other. Then, a potential between the diagnostic switch 21d and the operational amplifier 21a, that is a potential of a connection point connecting the output terminal of the operational amplifier 21a, the capacitor 21b and the switch 21c, is output as a diagnostic output for the sticking diagnosis.

The differential amplification circuit 22 includes a sampling and holding (SH) circuit 22a, an amplifying (AMP) circuit 22b and a low pass filter (LPF) circuit 22c. The SH circuit 22a is driven by a signal S3 from the control signal generating circuit 24. The SH circuit 22a samples the output from the C-V conversion circuit 21, and holds the output for a predetermined period. The AMP circuit 22b amplifies the sampled output with a predetermined gain. The LPF circuit 22c is driven by a clock signal F1 from the control signal generating circuit 24, and selects a signal in a predetermined frequency band component from the output of the AMP circuit 22b. Then, the LPF circuit 22c outputs the signal into an external circuit as a sensor output indicating an acceleration signal.

The high-voltage generating circuit 23 applies a voltage Vpp (8V) to an input side of the C-V conversion circuit 21 as a high-voltage for the sticking diagnosis. The high-voltage Vpp is larger than the reference voltage Vdd/2 (2.5V) applied in the normal acceleration-measuring mode. The input side of the C-V conversion circuit 21 corresponds to the inverting input terminal of the operational amplifier 21a. The high-voltage generating circuit 23 is driven by a signal T1 from the control signal generating circuit 24, and generates the high-voltage Vpp for the sticking diagnosis.

The control signal generating circuit 24 outputs the carrier wave voltage signals PW1, PW2, the signals S1, S2 for indicating the switching timing for the switch 21c and the diagnostic switch 21d, the signal T1 for controlling the high-voltage generating circuit 23, the signal S3 for controlling the SH circuit 22a and the signal F1 for driving the LPF circuit 22c.

Figure 2:
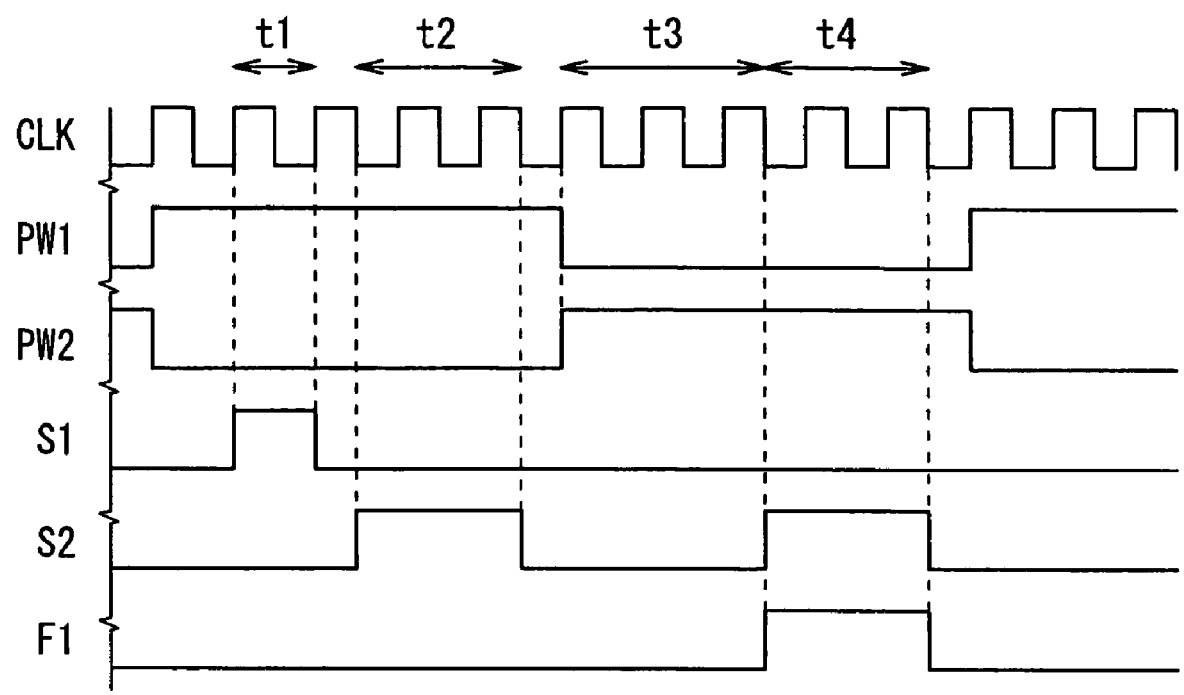
FIG. 2 is a time chart showing an operation of the capacitive acceleration sensor.

Next, an operation of the acceleration sensor will be described with reference to FIG. 2. First, the normal acceleration-measuring mode will be described.

In the normal mode, each of the signals PW1, PW2 from the control signal generating circuit 24 has a predetermined amplitude of a voltage Vdd (5V), and levels of the voltages Vdd of the signals PW1, PW2 are inverse to each other so that the signals PW1, PW2 are opposite in phase to each other. The signals PW1, PW2 have rectangular-wave shapes with the predetermined amplitude, and vary between a high level (Hi) and a low level (Lo) in four periods t1-t4 in each detection cycle.

In the first period t1, the signals PW1, PW2 set an electrical potential of the fixed electrode 2a to Vdd, and an electrical potential of the fixed electrode 2b to 0V. Further, the switch 21c is closed in response to the signal S1. Thus, the movable electrodes 1a, 1b have a bias voltage Vdd/2 by an operation of the amplifier 21a, and an electrical charge in the capacitor 21b is discharged, which will be a feedback capacitance.

At this time, if a capacitance C1 between the movable electrode 1a and the fixed electrode 2a is larger than a capacitance C2 between the movable electrode 1b and the fixed electrode 2b (C1>C2), the movable electrodes 1a, 1b hold a large amount of negative charges, because of this relation and the voltages applied to the fixed electrodes 2a, 2b.

In the second period t2, the signals PW1, PW2 set the electrical potential of the fixed electrode 2a to Vdd, and the electrical potential of the fixed electrode 2b to 0V. Further, the switch 21c is opened in response to the signal S1. Thereby, the capacitor 21b is charged with electricity corresponding to a state of the movable electrodes 1a, 1b. Then, the C-V conversion circuit 21 outputs a voltage signal corresponding to the charge in the capacitor 21b, and the SH circuit 22a samples the voltage signal in response to the signal S3.

In the third period t3, the signals PW1, PW2 set the electrical potential of the fixed electrode 2a to 0V, and the electrical potential of the fixed electrode 2b to Vdd. That is, the electrical potentials are interchanged. Further, the switch 21c is kept to be open by the signal S1.

At this time, a state of the electrical charge in the movable electrodes 1a, 1b is inverse to that in the second period t2 due to an inversion of the signals PW1, PW2. That is, when the capacitance C1 is larger than the capacitance C2 (C1>C2), the movable electrodes 1a, 1b hold a large amount of positive charges due to an inversion of the voltages applied to the fixed electrodes 2a, 2b.

However, at this time, because a circuit between the movable electrode 1a, 1b and the capacitor 21b is closed, the electrical charges discharged in the first period t1 are stored in the circuit. Therefore, a part of the electrical charges is transferred and stored in the capacitor 21b for balance. Then, the C-V conversion circuit 21 outputs a voltage signal, which is proportional to the transferred charge, and inversely proportional to a capacitance C of the capacitor 21b, based on a relation of Q=CV.

In the fourth period t4, the signals PW1, PW2 set the electrical potential of the fixed electrode 2a to 0V, and the electrical potential of the fixed electrode 2b to Vdd. After the voltage signal from the C-V conversion circuit 21 becomes sufficiently stable, the SH circuit 22a samples the voltage signal from the C-V conversion circuit 21 in response to the signal S3.

The AMP circuit 22b performs a differential calculation between the voltage signal sampled in the second period t2 and the voltage signal sampled in the fourth period t4, and outputs the calculated result. Based on the result, an acceleration corresponding to a displacement of the movable electrodes 1a, 1b can be detected.

Next, the diagnostic mode will be described. In the diagnostic mode, the high-voltage Vpp generated by the high-voltage generating circuit 23 is applied to an input side of the C-V conversion circuit 21. Further, the voltage signals PW1, PW2 applied to the fixed electrodes 2a, 2b are made larger than the signals PW1, PW2 in the normal mode, and the diagnostic switch 21d is opened. The other operations in the diagnostic mode may be made similar to those in the normal mode.

Specifically, the voltage signals PW1, PW2 are set to 10V, for example, in the diagnostic mode, while the voltage signals PW1, PW2 are set to 5V, for example, in the normal mode. Moreover, the high-voltage Vpp of 8V, for example, is applied to the input side of the C-V conversion circuit 21 from the high-voltage generating circuit 23, and the diagnostic switch 21d is opened in response to the signal S2.

In the first and second periods t1, t2, the high-voltage Vpp is applied to the input side of the C-V conversion circuit 21. Thereby, the high-voltage Vpp is also applied to the movable electrode 1a, 1b. At the same time, the signals PW1, PW2 set the electrical potential of the fixed electrode 2a to 10V, and the electrical potential of the fixed electrode 2b to 0V.

Thus, a potential difference between the fixed electrode 2b and the movable electrodes 1a, 1b becomes sufficiently larger than that between the fixed electrode 2a and the movable electrodes 1a, 1b. Thereby, the movable electrodes 1a, 1b are moved toward the fixed electrode 2b so as to make the movable electrode 1b in contact with the fixed electrode 2b.

Because the switch 21c is closed in the first period t1, the charge in the capacitor 21b is discharged, which will be the feedback capacitance. Further, because the switch 21c is opened in the second period t2, the capacitor 21b is charged with electricity corresponding to a state of the movable electrodes 1a, 1b.

At this time, a state of the movable electrodes 1a, 1b is different in cases in which any foreign object is stuck between the movable electrode 1b and the fixed electrode 2b or not. For example, when a foreign object is stuck between the movable electrode 1b and the fixed electrode 2b, the movable electrode 1b cannot be moved toward the fixed electrode 2b. Therefore, the amount of the electricity charged in the capacitor 21b changes, and a potential for a diagnostic output changes. By monitoring the potential and comparing it with a predetermined value, a sticking of a foreign object between the movable electrode 1b and the fixed electrode 2b can be detected.

In the third and fourth periods t3, t4, the electrical potentials of the fixed electrodes 2a, 2b are reversed. That is, the signals PW1, PW2 set the electrical potential of the fixed electrode 2a to 0V, and the electrical potential of the fixed electrode 2b to 10V.

Thus, the potential difference between the fixed electrode 2a and the movable electrodes 1a, 1b becomes sufficiently larger than that between the fixed electrode 2b and the movable electrodes 1a, 1b. Thereby, the movable electrodes 1a, 1b are moved toward the fixed electrode 2a so as to make the movable electrode 1a in contact with the fixed electrode 2a.

Similarly to the first and second periods t1, t2, a state of the movable electrodes 1a, 1b is different in cases in which any foreign object is stuck between the movable electrode 1a and the fixed electrode 2a or not. Therefore, the amount of the electricity charged in the capacitor 21b changes, and the potential for the diagnostic output changes. By monitoring the potential and comparing it with a predetermined value, a sticking of a foreign object between the movable electrodes 1a and the fixed electrode 2a can be detected.

According to this embodiment, the above-described acceleration sensor includes the diagnostic switch 21d and the high-voltage generating circuit 23. In the diagnostic mode, the sticking between the movable electrode 1a, 1b and the fixed electrode 2a, 2b can be detected by monitoring the potential of the output side of the C-V conversion circuit 21 as the diagnostic output. The output side of the C-V conversion circuit 21 represents the connection point connecting the output terminal of the operational amplifier 21a, the capacitor 21b and the switch 21c.

Further, in the diagnostic mode, the diagnostic switch 21d is opened. Thus, the potential of the connection point is not transmitted to the differential amplification circuit 22. That is, when the high-voltage Vpp (8V) is applied to the inverting input terminal of the operational amplifier 21a, the output from the C-V conversion circuit 21 is not transmitted to the differential amplification circuit 22. Therefore, a transistor (not shown) in the differential amplification circuit 22 is not required to withstand a large voltage corresponding to the diagnostic output. Then, a size of a semiconductor chip included in the detecting circuit 20 is not required to be large. Accordingly, the sticking diagnosis can be performed in the acceleration sensor for detecting a relatively large acceleration.

Other Embodiments

In the above embodiment, the high-voltage Vpp (8V) is applied to the inverting input terminal of the operational amplifier 21a. Alternatively, the high-voltage Vpp may be applied to a non-inverting input terminal of the operational amplifier 21a.

Alternatively, if the acceleration sensor has a self-diagnostic function, a circuit capable of generating the high-voltage Vpp may be originally included in the acceleration sensor. In this case, the circuit capable of generating the high-voltage Vpp may function as the high-voltage generating circuit 23.

In addition, a pressure sensor or a yaw rate sensor may be used as the capacitive physical quantity sensor, other than the acceleration sensor described in the above embodiment.

Such changes and modifications are to be understood as being within the scope of the present invention as defined by the appended claims.

What is claimed is:

1. A capacitive sensor for detecting a physical quantity, the sensor comprising:
a sensor element including a movable electrode displaceable in accordance with a physical quantity, and a fixed electrode faced to the movable electrode, wherein a periodic carrier wave voltage is applied to the fixed electrode; and
a detecting circuit including
a C-V conversion circuit for outputting a voltage signal corresponding to a capacitance between the movable and fixed electrodes, wherein the C-V conversion circuit includes a diagnostic switch, a differential amplification circuit for differentially amplifying the voltage signal from the C-V conversion circuit and outputting the amplified signal as a sensor output in a normal measuring mode, and a high-voltage generating circuit for applying a diagnostic voltage to an input side of the C-V conversion circuit in a diagnostic mode so as to diagnose a sticking of a foreign object between the movable electrode and the fixed electrode, wherein the periodic carrier wave voltage in the diagnostic mode is larger than the periodic carrier wave voltage in the normal mode, the diagnostic switch is provided between the C-V conversion circuit and the differential amplification circuit, and closed in the normal mode so as to input the voltage signal from the C-V conversion circuit into the differential amplification circuit, and the diagnostic switch is opened in the diagnostic mode so as to disconnect the C-V conversion circuit and the differential amplification circuit.

2. The capacitive sensor according to claim 1, wherein:

the fixed electrode includes a first fixed electrode, to which a first periodic carrier wave voltage is applied, and a second fixed electrode, to which a second periodic carrier wave voltage is applied; and the first and second periodic carrier wave voltages are inverse to each other.

3. The capacitive sensor according to claim 2, wherein:

the diagnostic voltage is larger than a half voltage of the first periodic carrier wave voltage and the second periodic carrier wave voltage so as to move the movable electrode toward the fixed electrode.

4. The capacitive sensor according to claim 1, wherein:

the C-V conversion circuit further includes an operational amplifier having an inverting input terminal connected to the movable electrode, wherein a signal corresponding to the capacitance is input into the inverting input terminal, a capacitor connected between the inverting input terminal and an output terminal of the operational amplifier, and a switch connected in parallel to the capacitor; and the diagnostic voltage is applied to the inverting input terminal of the operational amplifier.

5. The capacitive sensor according to claim 4, wherein:

the diagnostic voltage is larger than a reference voltage applied to a non-inverting input terminal of the operational amplifier in the normal mode.

6. The capacitive sensor according to claim 1, wherein:

the C-V conversion circuit further includes an operational amplifier having an inverting input terminal, into which a signal corresponding to the capacitance is input, a capacitor connected between the inverting input terminal and an output terminal of the operational amplifier, and a switch connected in parallel to the capacitor; and the diagnostic voltage is applied to a non-inverting input terminal of the operational amplifier.

7. The capacitive sensor according to claim 6, wherein:

the diagnostic voltage is larger than a reference voltage applied to the non-inverting input terminal of the operational amplifier in the normal mode.

* * * * *